(12) United States Patent
Shin

(10) Patent No.: US 12,439,711 B2
(45) Date of Patent: Oct. 7, 2025

(54) IMAGE SENSING DEVICE WITH IMPROVED TRANSFER TRANSISTOR

(71) Applicant: SK hynix Inc., Icheon-si (KR)

(72) Inventor: Jong Hwan Shin, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 1134 days.

(21) Appl. No.: 17/354,968

(22) Filed: Jun. 22, 2021

(65) Prior Publication Data

US 2022/0285414 A1    Sep. 8, 2022

(30) Foreign Application Priority Data

Mar. 8, 2021    (KR) .......................... 10-2021-0029831

(51) Int. Cl.
*H10F 39/00*    (2025.01)
*H10F 39/18*    (2025.01)

(52) U.S. Cl.
CPC ....... *H10F 39/80373* (2025.01); *H10F 39/18* (2025.01)

(58) Field of Classification Search
CPC ......... H01L 27/14614; H10F 39/80373; H10F 39/18; H10F 39/8023; H10F 39/807; H10F 39/802
See application file for complete search history.

(56) References Cited

U.S. PATENT DOCUMENTS

| | | | |
|---|---|---|---|
| 2009/0046186 A1* | 2/2009 | Nagai | H10F 39/813 348/301 |
| 2009/0050997 A1* | 2/2009 | Mutoh | H10F 39/813 438/69 |
| 2011/0108897 A1 | 5/2011 | Koo et al. | |
| 2013/0076934 A1* | 3/2013 | Maeda | H01L 27/14641 348/222.1 |

(Continued)

FOREIGN PATENT DOCUMENTS

| | | |
|---|---|---|
| CN | 102169883 A | 8/2011 |
| CN | 112185986 A | 1/2021 |

(Continued)

OTHER PUBLICATIONS

1st Office Action mailed on Jul. 9, 2024 for CN Appl. No. 202111393560.4, 14 pages with English translation.

*Primary Examiner* — William B Partridge
*Assistant Examiner* — Gustavo G Ramallo
(74) *Attorney, Agent, or Firm* — Perkins Coie LLP

(57) ABSTRACT

Image sensing devices are disclosed. In some implementations, an image sensing device may include a substrate including an upper region and a lower region, a photoelectric conversion element structured to convert light into electrical charges and formed in the lower region of the substrate, a floating diffusion region formed in the upper region of the substrate and coupled to receive the electrical charges from the photoelectric conversion element, and a transfer gate formed in the upper region of the substrate adjacent to the (Continued)

floating diffusion region and coupled between the floating diffusion region and the photoelectric conversion element to transfer the electrical charges from the photoelectric conversion element to the floating diffusion region, the transfer gate including a recess electrode structured to have a triangular cross-sectional shape to provide a path for transferring the electrical charges.

23 Claims, 17 Drawing Sheets

(56) References Cited

U.S. PATENT DOCUMENTS

| | | | | |
|---|---|---|---|---|
| 2013/0320407 | A1 | 12/2013 | Ahn | |
| 2014/0252420 | A1* | 9/2014 | Yi | H01L 27/1463 |
| | | | | 257/229 |
| 2015/0243701 | A1* | 8/2015 | Oh | H01L 27/14689 |
| | | | | 438/75 |
| 2016/0086984 | A1* | 3/2016 | Wang | H01L 27/14689 |
| | | | | 257/292 |
| 2020/0176492 | A1* | 6/2020 | Huang | H10F 39/8023 |
| 2021/0005652 | A1* | 1/2021 | Gu | H10F 39/18 |
| 2023/0275106 | A1* | 8/2023 | Kim | H10F 39/8033 |
| | | | | 257/292 |
| 2023/0317760 | A1* | 10/2023 | Yang | H10F 39/014 |
| | | | | 257/292 |

FOREIGN PATENT DOCUMENTS

| | | |
|---|---|---|
| KR | 10-2014-0111492 | 9/2014 |
| KR | 10-2015-0100382 | 9/2015 |
| KR | 20210004595 A | 1/2021 |

* cited by examiner

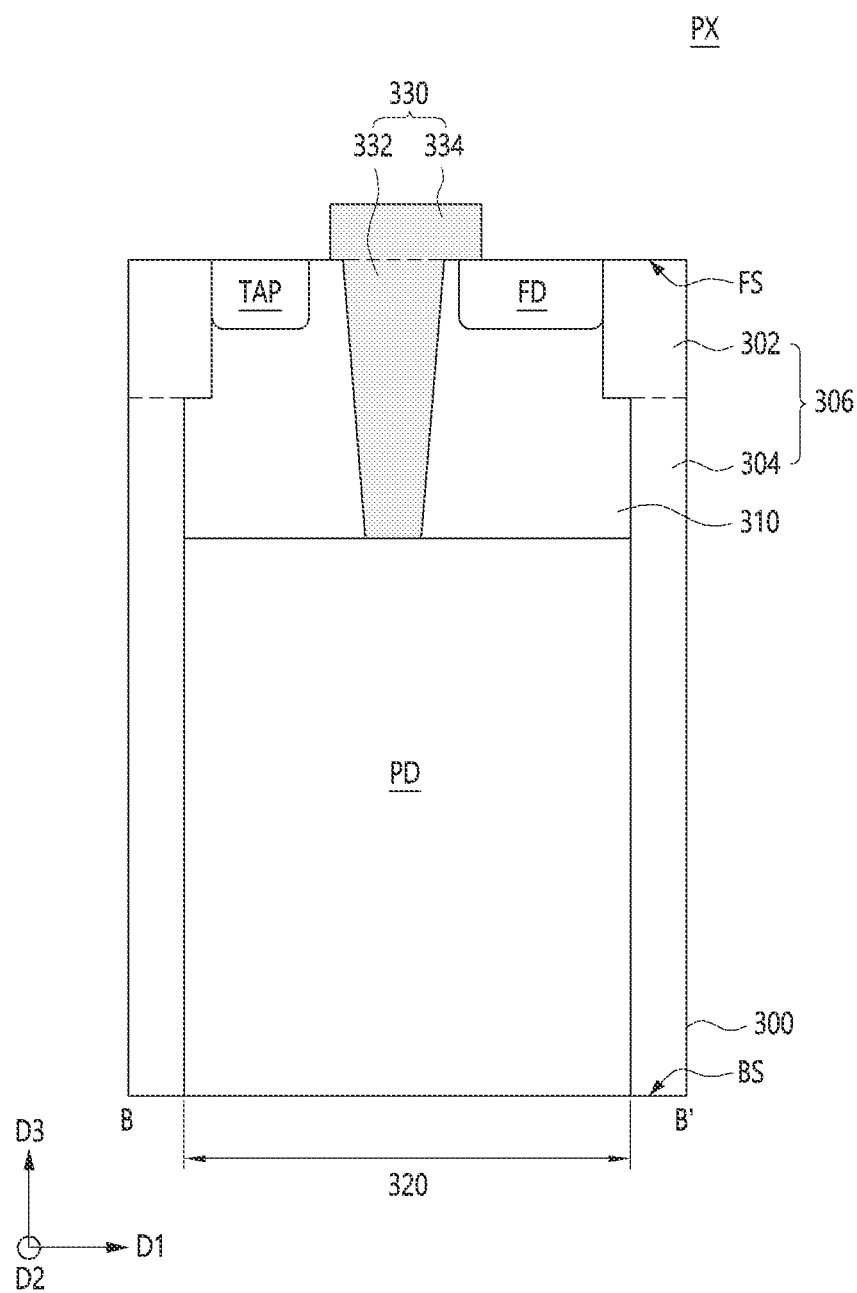

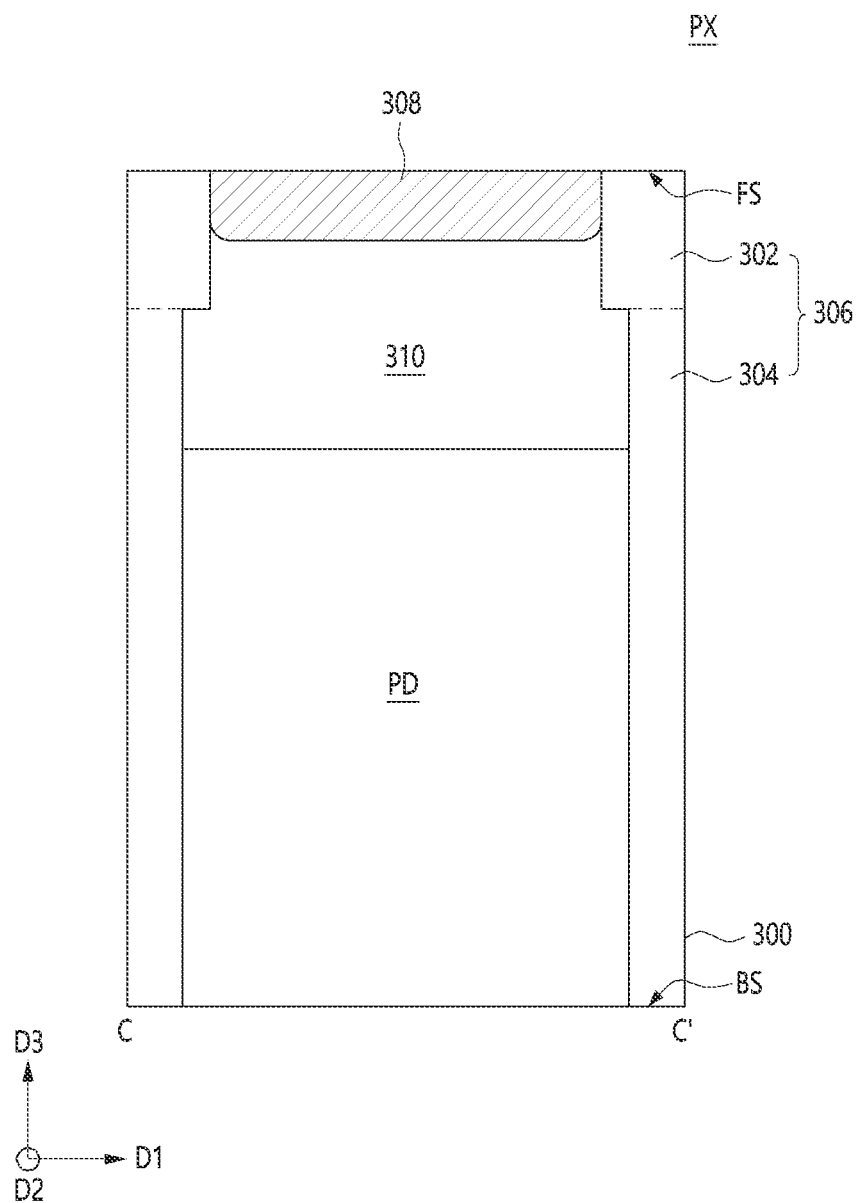

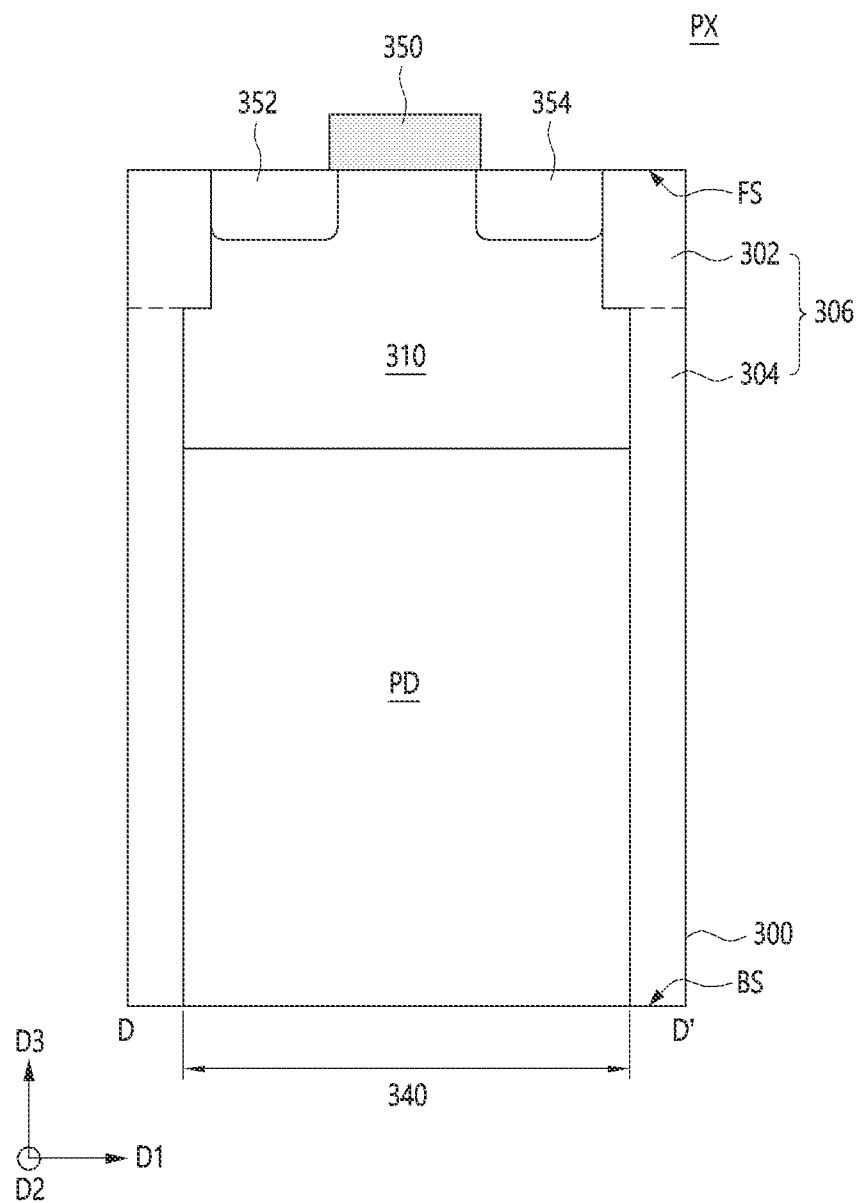

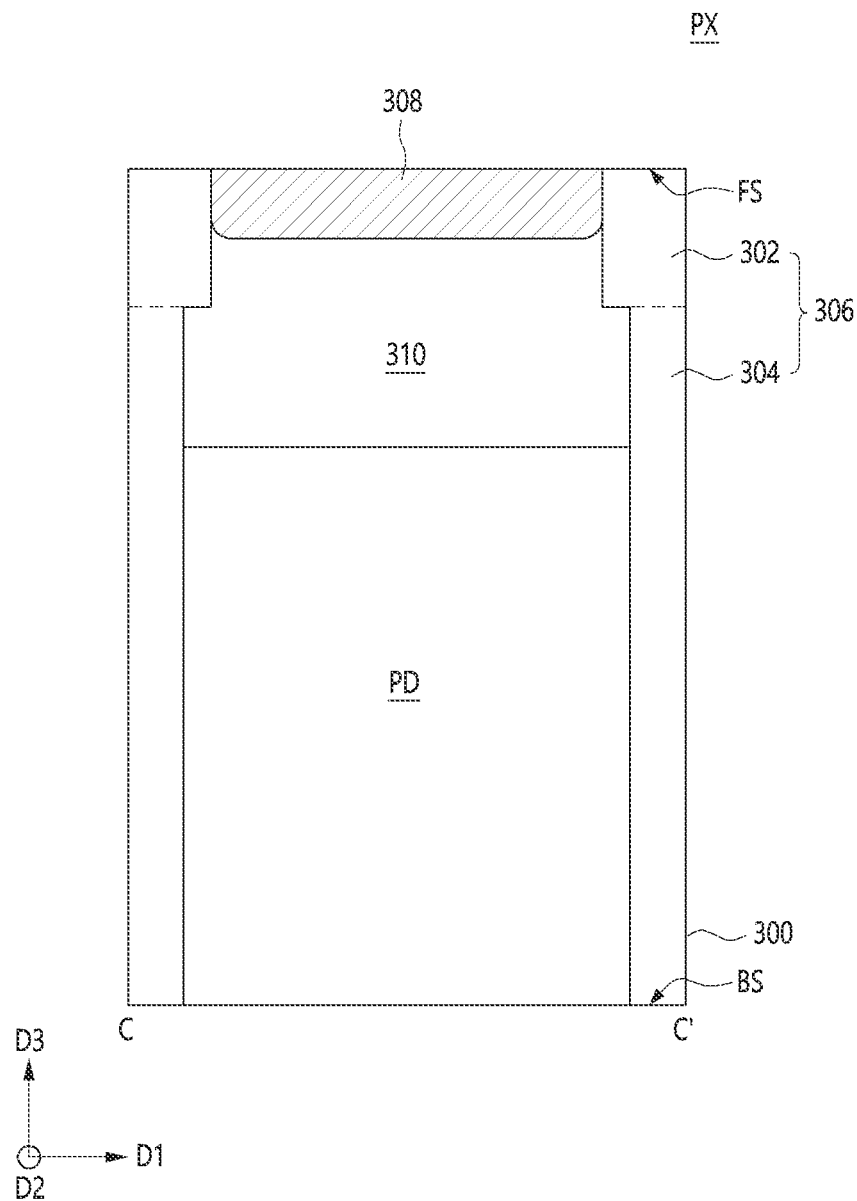

IMAGE SENSING DEVICE WITH IMPROVED TRANSFER TRANSISTOR

CROSS-REFERENCES TO RELATED APPLICATION

This patent document claims the priority and benefits of Korean patent application number 10-2021-0029831, filed on Mar. 8, 2021, which is incorporated herein by reference in its entirety.

TECHNICAL FIELD

The embodiments of the disclosed technology relate to an image sensing device.

BACKGROUND

An image sensing device is used in electronic devices to convert optical images into electrical signals. The recent development of computer and communication industries is leading to an increase in demand for higher-performance image sensing devices in various devices such as smart phones, digital cameras, camcorders, personal communication systems (PSCs), game consoles, security cameras, medical micro cameras, robots, and infrared sensing devices.

CMOS image sensing devices have advantages over other types of image sensors in terms of how image sensing signals are processed. In addition, CMOS image sensing devices are fabricated using the CMOS fabrication technology, and thus CMOS image sensors and other signal processing circuitry can be integrated into a single chip, enabling the production of miniaturized CMOS image sensing devices, low power consumption image sensors at a lower cost.

SUMMARY

The disclosed technology can be implemented in some example embodiments to provide an image sensing device that can improve a charge transfer efficiency between a photoelectric conversion element and a floating diffusion region.

In some implementations, an image sensing device may include a substrate including an upper region and a lower region, a photoelectric conversion element structured to convert light into electrical charges and formed in the lower region of the substrate, a floating diffusion region formed in the upper region of the substrate and coupled to receive the electrical charges from the photoelectric conversion element, and a transfer gate formed in the upper region of the substrate adjacent to the floating diffusion region and coupled between the floating diffusion region and the photoelectric conversion element to transfer the electrical charges from the photoelectric conversion element to the floating diffusion region, the transfer gate including a recess electrode structured to have a triangular cross-sectional shape to provide a path for transferring the electrical charges.

In some implementations, an image sensing device may include a substrate including an upper region and a lower region, a photoelectric conversion element structured to convert light into electrical charges and formed in the lower region of the substrate, a floating diffusion region formed in the upper region of the substrate to receive the electrical charges from the photoelectric conversion element, and a transfer gate formed adjacent to the floating diffusion region to provide a path to the electrical charges moving from the photoelectric conversion element to the floating diffusion region. The transfer gate comprises a recess electrode formed in the upper region of the substrate and structured to have a first cross-sectional shape, and a plate electrode formed on the substrate and electrically connected with the recess electrode and structured to have a second cross-sectional shape different from the first cross-sectional shape.

In some implementations, an image sensing device may include a substrate including an upper region and a lower region, a photoelectric conversion element structured to convert light into electrical charges and formed in the lower region of the substrate, a floating diffusion region formed in the upper region of the substrate to receive the electrical charges from the photoelectric conversion element, and a transfer gate coupled between the floating diffusion region and the photoelectric conversion element to transfer the electrical charges from the photoelectric conversion element to the floating diffusion region. The transfer gate comprises a first recess electrode formed in the upper region of the substrate and structured to have a first cross-sectional shape, a second recess electrode spaced apart from the first recess electrode in the upper region of the substrate and structured to have a second cross-sectional shape, and a plate electrode formed on the substrate and electrically connected with the first and second recess electrodes and structured to have a third cross-sectional shape different from the first and second cross-sectional shapes.

In some implementations, an image sensing device may include a photoelectric conversion element, a floating diffusion region and a transfer gate. The photoelectric conversion element may be formed at a lower region of a substrate. The floating diffusion region may be formed at an upper region of the substrate. The transfer gate may be formed at the upper region of the substrate adjacent to the floating diffusion region. The transfer gate may include a recess electrode having a triangular cross-sectional shape.

In some implementations, an image sensing device may include a photoelectric conversion element, a floating diffusion region and a transfer gate. The photoelectric conversion element may be formed at a lower region of a substrate. The floating diffusion region may be formed at an upper region of the substrate. The transfer gate may include a recess electrode and a plate electrode. The recess electrode may be formed at the upper region of the substrate. The recess electrode may have a first cross-sectional shape. The plate electrode may be formed on the substrate to be electrically connected with the recess electrode. The plate electrode may have a second cross-sectional shape different from the first cross-sectional shape.

In some implementations, an image sensing device may include a photoelectric conversion element, a floating diffusion region and a transfer gate. The photoelectric conversion element may be formed at a lower region of a substrate. The floating diffusion region may be formed at an upper region of the substrate. The transfer gate may include a first recess electrode, a second recess electrode and a plate electrode. The first recess electrode may be formed at the upper region of the substrate. The first recess electrode may have a first cross-sectional shape. The second recess electrode May be formed at the upper region of the substrate. The second recess electrode may be spaced apart from the first recess electrode. The second recess electrode may have a second cross-sectional shape. The plate electrode may be formed on the substrate to be electrically connected with the first and second recess electrodes. The plate electrode may have a third cross-sectional shape different from the first and second cross-sectional shapes.

In some implementations of the disclosed technology, the transfer gate adjacent to the floating diffusion region may include the recess electrode having the triangular shape or a polygonal shape and the plate electrode having the cross-sectional shape different from the shape of the recess electrode so that charge transfer efficiency between the photoelectric conversion element and the floating diffusion region may be improved. Thus, an image lag may not be generated.

BRIEF DESCRIPTION OF THE DRAWINGS

FIG. 5B a cross-sectional view taken along a line B-B' in FIG. 4. IG. 5C a cross-sectional view taken along a line C-C' in FIG. 4. FIG. 5D a cross-sectional view taken along a line D-D' in FIG. 4.

DETAILED DESCRIPTION

Features of the technology disclosed in this patent document are described by examples of an image sensing device with reference to the accompanying drawings. Although a few embodiments of the disclosed technology will be discussed, the disclosed technology can be implemented in various ways beyond the specifics of the examples described herein.

The disclosed technology can be implemented in some embodiments to provide an image sensing device that includes a transfer transistor configured to improve charge transfer efficiency between a photoelectric conversion element and a floating diffusion region (FD) region, preventing image lags.

In example embodiments discussed below, a first direction D1, a second direction D2 and a third direction D3 may include three directions perpendicular to each other. For example, the first direction D1 may be an X-direction, the second direction D2 may be a Y-direction and the third direction D3 may be a Z-direction in an XYZ coordinate.

Figure 1:
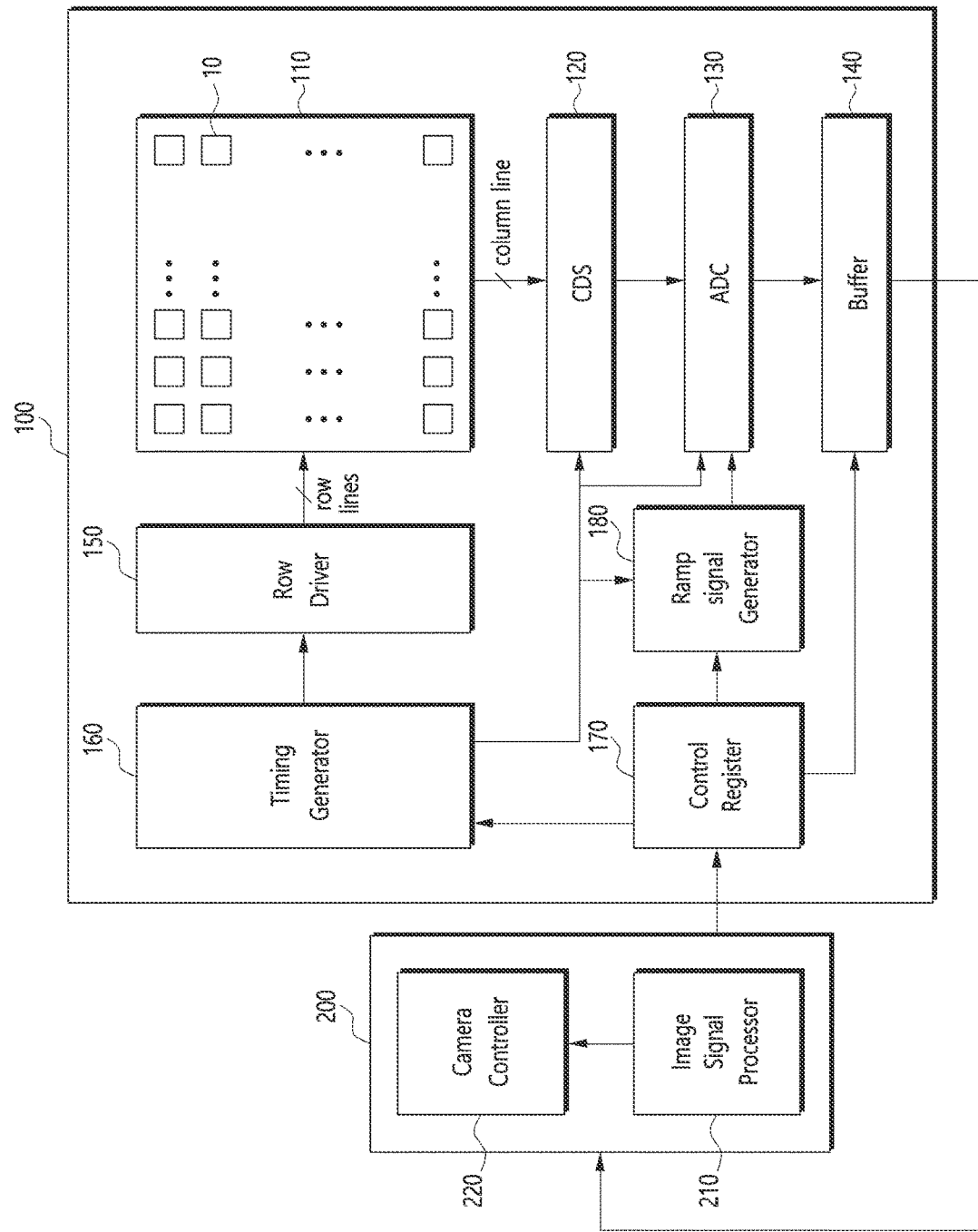
FIG. 1 illustrates an example of an image sensing device based on some embodiments of the disclosed technology.

FIG. 1 illustrates an example of an image sensing device based on some embodiments of the disclosed technology.

Referring to FIG. 1, an image sensing device 100 based on some implementations may include a pixel array 110, a correlated double sampler (CDS) 120, an analog-digital converter (ADC) 130, a buffer 140, a row driver 150, a timing generator 160, a control register 170 and a ramp signal generator 180. The pixel array 110 may include a plurality of image sensing pixels arranged in a matrix array. The elements of the image sensing device 100 shown in FIG. 1 are for illustration and not limitation. In other embodiments, the elements may be combined with additional elements, or some of the elements may be omitted.

The image sensing device 100 may have a lens (not shown). The lens may include an optical lens or assembly of lenses used in conjunction with the image sensing device 100 to cause light corresponding to an image of an object to converge, and an image processor 200 may control the lens. The image processor 200 may transmit electrical signals corresponding to an image captured by the image sensing device 100 to an electronic device such as a display device.

The image processor 200 may include a camera controller 220, an image signal processor 210 and an interface device (e.g., PC I/F, not shown). The camera controller 220 may be configured to control the control register 170. In some implementations, the camera controller 220 may control the control register 170 of the image sensing device 100 using an interface or communication bus such as an inter-integrated circuit (I2C). The image signal processor 210 may receive image information as an output signal from the buffer 140. The image signal processor 210 may process image information to improve the quality of the image corresponding to the image information for viewing on the display device.

The pixel array 110 may include a plurality of pixel groups 10 arranged in the matrix array. Each of the pixel groups 10 may include a plurality of unit pixels adjacent to each other. For example, each of the pixel groups 10 based on an embodiment of the disclosed technology may include four unit pixels arranged in a (2×2) matrix array, for example. In another embodiment, each of the pixel groups may have a (1×2) matrix array, a (2×3) matrix array, a (3×3) matrix array, or a (4×4) matrix array. Each of the unit pixels May convert optical images into electrical image signals. Each of the unit pixels may transmit the electrical image signal to the CDS 120. The pixel array 110 may include a plurality of photo-converter devices such as photodiode or photodetector to detect or convert incident light into electrical signals.

The CDS 120 may hold and sample the electrical signal from the pixels of the pixel array 110. For example, the CDS 120 may sample a reference voltage level and a voltage level of the received electrical image signal based on a clock signal provided from the timing generator 160. The CDS 120 may transmit an analog signal corresponding to a difference between the reference voltage level and the voltage level of the electrical image signal to the ADC 130.

The ADC 130 may convert the received analog signal into a digital signal and then transmit the digital signal to the buffer 140.

The buffer 140 may hold or latch the received digital signal. The buffer 140 may sequentially output the latched digital signal to an image signal processor 210. The buffer 140 may include a memory configured to hold or latch the digital signal and a sense amplifier configured to amplify the digital signal.

The row driver 150 may activate the pixels of the pixel array 110 to detect or convert the incident light based on a signal provided by the timing generator 160. For example, the row driver 150 may generate selection signals or drive signals for selecting or activating one or more row lines among a plurality of row lines.

The timing generator 160 may generate one or more timing signals for controlling the CDS 120, the ADC 130, the row driver 150 and the ramp signal generator 180.

The control register 170 may generate control signals for controlling the buffer 140, the timing generator 160 and the ramp signal generator 180. The buffer 140, the timing generator 160 and the ramp signal generator 180 may be controlled by the control signals from the control register 170. The control register 170 may be operated by the camera controller.

The ramp signal generator 180 may generate a ramp signal for processing the image signal outputted from the buffer 140 according to the control of the timing generator 160.

Figure 2:
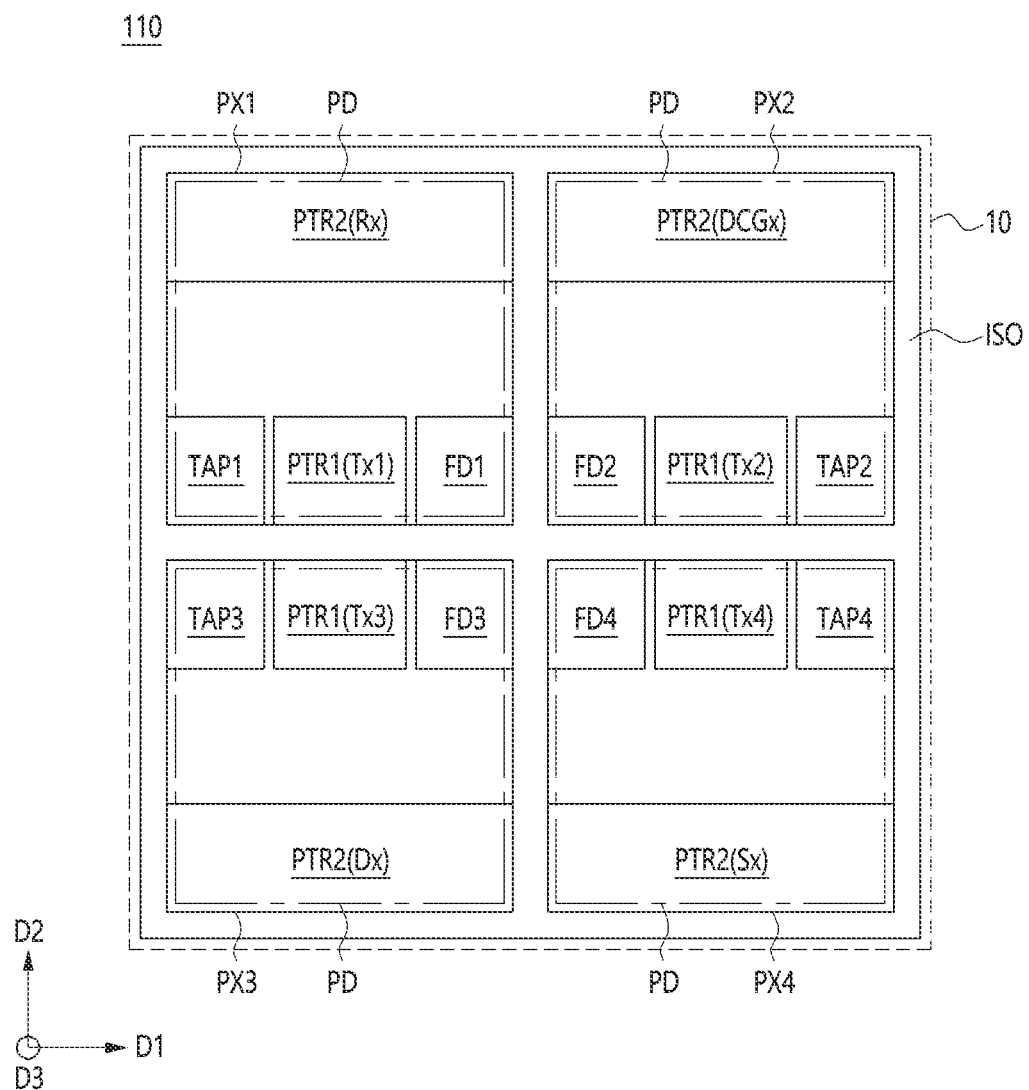
FIG. 2 illustrates an example of a pixel array of an image sensing device based on some embodiments of the disclosed technology.
Figure 3:
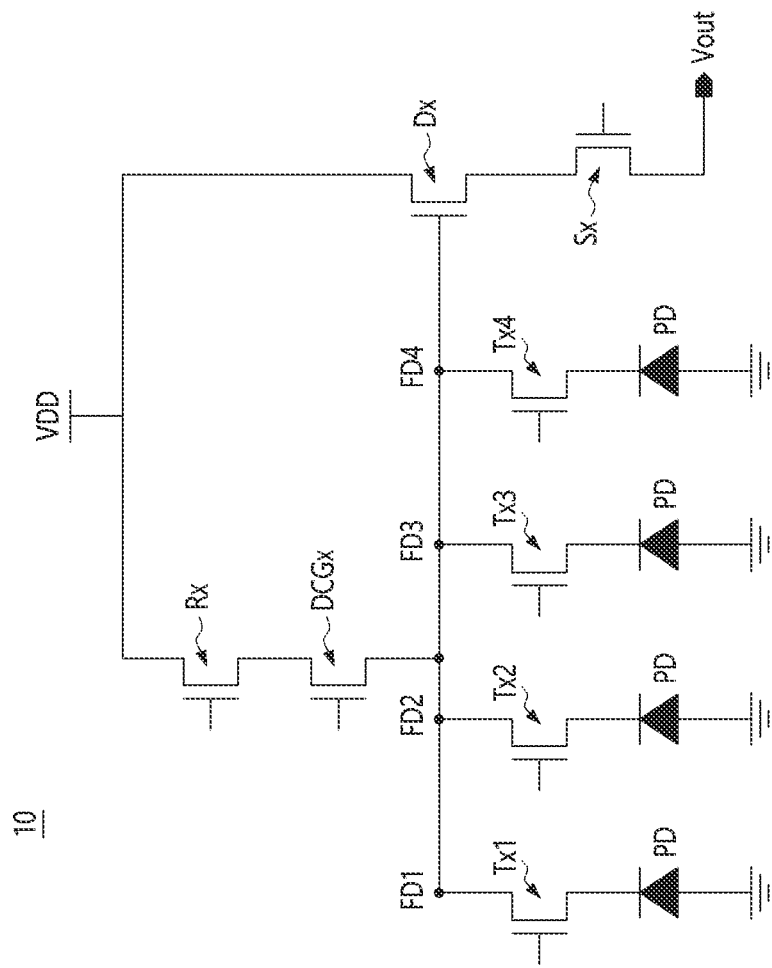
FIG. 3 illustrates an example of a pixel group based on some embodiments of the disclosed technology.

FIG. 2 illustrates an example of a pixel array of an image sensing device based on some embodiments of the disclosed technology, and FIG. 3 illustrates an example of a pixel group based on some embodiments of the disclosed technology.

Referring to FIGS. 2 and 3, the pixel array 110 may include the pixel groups 10 sequentially arranged in a matrix array. Each of the pixel groups 10 may include a plurality of the unit pixels. For example, each of the pixel groups 10 may include a first unit pixel PX1 to a fourth unit pixel PX4 arranged in a (2×2) matrix array.

Each of the first unit pixel PX1 to the fourth unit pixel PX4 may include image sensor pixels that are physically, electrically, and/or optically isolated by an isolation structure ISO. That is, pixel regions including the first unit pixel PX1 to the fourth unit pixel PX4 may be defined by the isolation structure ISO. In an implementation, the pixel regions may be isolated from each other by the isolation structure ISO formed in a substrate to a certain depth from either a front surface or a back surface of the substrate. In another implementation, the pixel regions may be isolated from each other by the isolation structure ISO formed in the substrate from the front surface to the back surface of the substrate.

Each of the first to fourth unit pixels PX1, PX2, PX3 and PX4 (pixel region) may have a polygonal shape in plan view. For example, each of the first to fourth unit pixels PX1, PX2, PX3 and PX4 may have a square shape. The isolation structure ISO for isolating the first to fourth unit pixels PX1, PX2, PX3 and PX4 from each other may be a grid type. The isolation structure ISO may include a trench type isolation structure and a junction type isolation structure, or a combination of the trench type isolation structure and the junction type isolation structure. The trench type isolation structure may include a trench formed on the substrate and an insulating material layer formed in the trench. The junction type isolation structure may include an impurity region.

Each of the first to fourth unit pixels PX1, PX2, PX3 and PX4 may include a photoelectric conversion element PD. The photoelectric conversion element PD may generate photo-generated electrical currents corresponding to the incident light. Examples of the photoelectric conversion element PD may include a photodiode, a phototransistor, a photogate, a pinned photodiode (PPD), or a combination of two or more of the photodiode, a phototransistor, a photogate, a pinned photodiode (PPD). For example, the 10) photoelectric conversion element PD may include the photodiode. The photodiode may include an N type impurity region and a P type impurity region that are vertically stacked in the substrate.

Each of the first to fourth unit pixels PX1, PX2, PX3 and PX4 may include a floating diffusion region FD and a tap region TAP. The floating diffusion region FD may be positioned at one corner of each pixel region, and the tap region TAP may be positioned at another corner of each pixel regions. The floating diffusion region FD and the tap region TAP may overlap with the photoelectric conversion element PD formed in each pixel regions. The floating diffusion region FD and the tap region TAP may be aligned with each other the first direction D1. The floating diffusion region FD and the tap region TAP may include impurity regions which are formed in the substrate. The floating diffusion region FD has an opposite conductivity type to the tap region TAP. For example, the floating diffusion region FD may be an N type impurity region and the tap region TAP may be a P type impurity region.

In some implementations, as illustrated in FIG. 2, the first unit pixel PX1 may be positioned at a left upper area of the pixel group 10. A first floating diffusion region FD1 of the first unit pixel PX1 may be located at a right lower corner of the first unit pixel PX1. A first tap region TAP1 of the first unit pixel PX1 may be located at a left lower corner of the first unit pixel PX1. The second unit pixel PX2 may be positioned at a right upper area of the pixel group 10. A second floating diffusion region FD2 of the second unit pixel PX2 may be located at a left lower corner of the second unit pixel PX2. A second tap region TAP2 of the second unit pixel PX2 may be located at a right lower corner of the second unit pixel PX2. The third unit pixel PX3 may be positioned at a left lower area of the pixel group 10. A third floating diffusion region FD3 of the third unit pixel PX3 may be located at a right upper corner of the third unit pixel PX3. A third tap region TAP3 of the third unit pixel PX3 may be located at a left upper corner of the third unit pixel PX3. The fourth unit pixel PX4 may be positioned at a right lower area of the pixel group 10. A fourth floating diffusion region FD4 of the fourth unit pixel PX4 may be located at a left upper corner of the fourth unit pixel PX4. A fourth tap region TAP4 of the fourth unit pixel PX4 may be located at a right upper corner of the fourth unit pixel PX4. Thus, the first to fourth floating diffusion regions FD1, FD2, FD3 and FD4 in the pixel group 10 may be formed adjacent to each other. Further, the first to fourth floating diffusion regions FD1, FD2, FD3 and FD4 may be electrically connected with each other via conductive lines.

Each of the first to fourth unit pixels PX1, PX2, PX3 and PX4 may include a first pixel transistor PTR1 and a second pixel transistor PTR2. The first and second pixel transistors PTR1 and PTR2 may overlap with the photoelectric conversion element PD. The first pixel transistor PTR1 may be spaced apart from the second pixel transistor PTR2. The first pixel transistor PTR1 may be positioned between the floating diffusion region FD and the tap region TAP in the first direction D1. The first pixel transistor PTR1 may include a transfer transistor Tx configured to transfer photo-generated charge carriers generated by the photoelectric conversion element PD to the floating diffusion region FD in response to a transmission signal. The second pixel transistor PTR2 may be formed adjacent to the first pixel transistor PTR1 in the second direction D2. The second pixel transistor PTR2 may include a reset transistor Rx, a drive transistor Dx, a selection transistor Sx and a conversion gain transistor DCGx. The reset transistor Rx may be configured to initialize the floating diffusion region FD in response to a reset signal. The drive transistor Dx may be configured to generate an amplified output signal Vout corresponding to an amount of photo-generated charge carriers stored in the floating diffusion region FD. The selection transistor Sx may be configured to transmit an output signal to a column line in FIG. 1 in response to a selection signal. The conversion gain transistor DCGx may be configured to change a capacitance of the floating diffusion region FD in response to a conversion gain signal.

For example, the reset transistor Rx may be positioned at the first unit pixel PX1. The conversion gain transistor DCGx may be positioned at the second unit pixel PX2. The drive transistor Dx may be positioned at the third unit pixel PX3. The selection transistor Sx may be positioned at the fourth unit pixel PX4. The floating diffusion region FD, the reset transistor Rx, the conversion gain transistor DCGx, the drive transistor Dx and the selection transistor Sx may be electrically connected with each other via the conductive lines in FIG. 3.

In an implementation, the conversion gain transistor DCGx may be electrically connected between the floating diffusion region FD and the reset transistor Rx. In another implementation, the floating diffusion region FD may be electrically connected between the reset transistor Rx and the conversion gain transistor DCGx.

For example, as shown in FIG. 3, the reset transistor Rx and the conversion gain transistor DCGx may be connected in series. A drain of the reset transistor Rx may be connected to a VDD terminal and a source of the conversion gain transistor DCGx may be connected to the first to fourth floating diffusion regions FD1 to FD4 in common. The first transfer transistor Tx1 and the photoelectric conversion element PD, which are connected in series, are connected between the first floating diffusion region FD1 and a ground. The second transfer transistor Tx2 and the photoelectric conversion element PD, which are connected in series, are connected between the second floating diffusion region FD2 and the ground. The third transfer transistor Tx3 and the photoelectric conversion element PD, which are connected in series, are connected between the third floating diffusion region FD3 and the ground. The fourth transfer transistor Tx4 and the photoelectric conversion element PD, which are connected in series, are connected between the fourth floating diffusion region FD4 and the ground. A drain of the drive transistor Dx may be connected to the VDD terminal and a gate of the drive transistor Dx may be connected to a connection node of the first to fourth floating diffusion regions FD1 to FD4 and the source of the conversion gain transistor DCGx. The selection transistor Sx may be connected between a source of the drive transistor and a Vout terminal.

Figure 4:
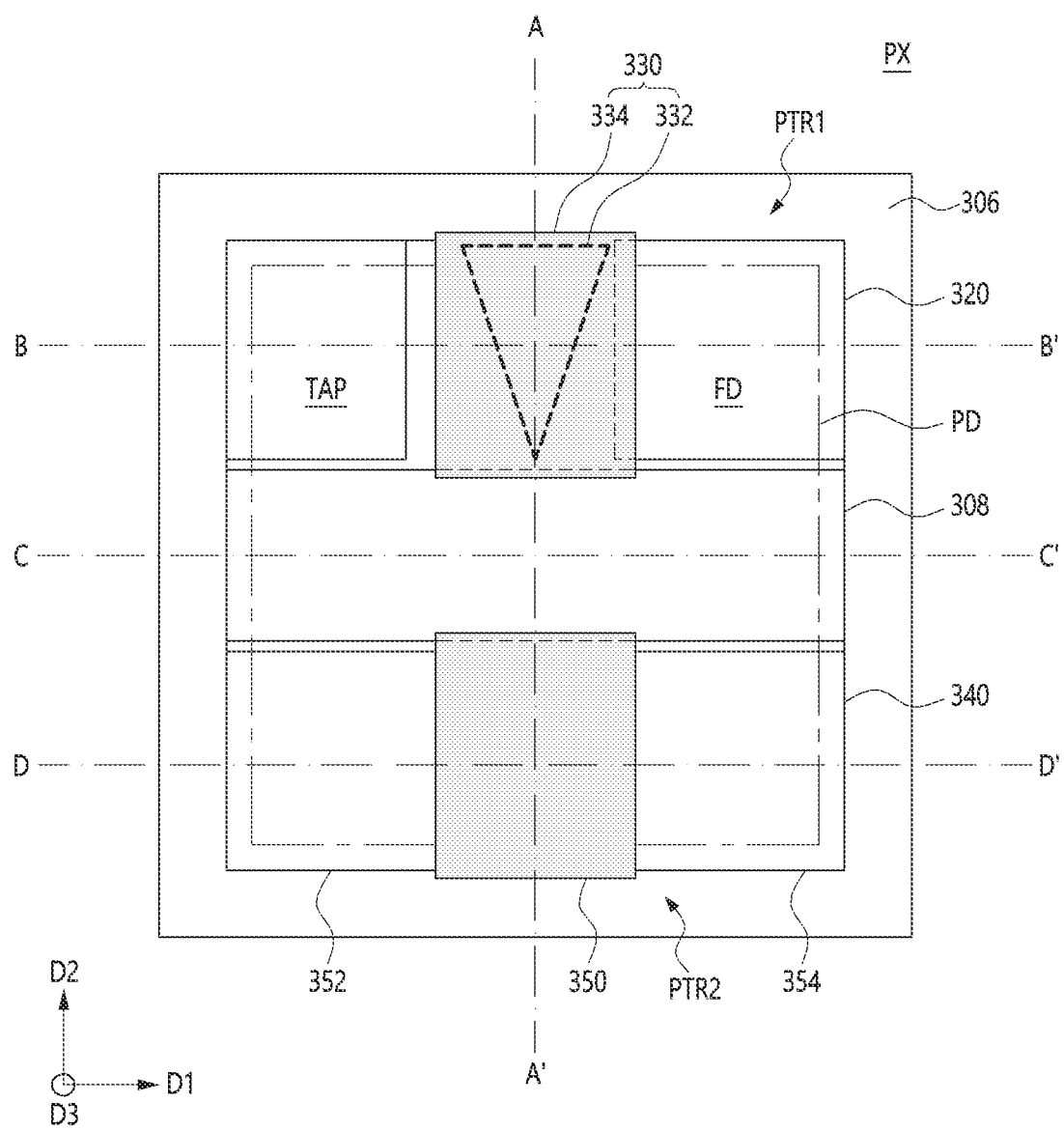
FIG. 4 illustrates an example of a unit pixel of an image sensing device based on some embodiments of the disclosed technology.
Figure 5A:
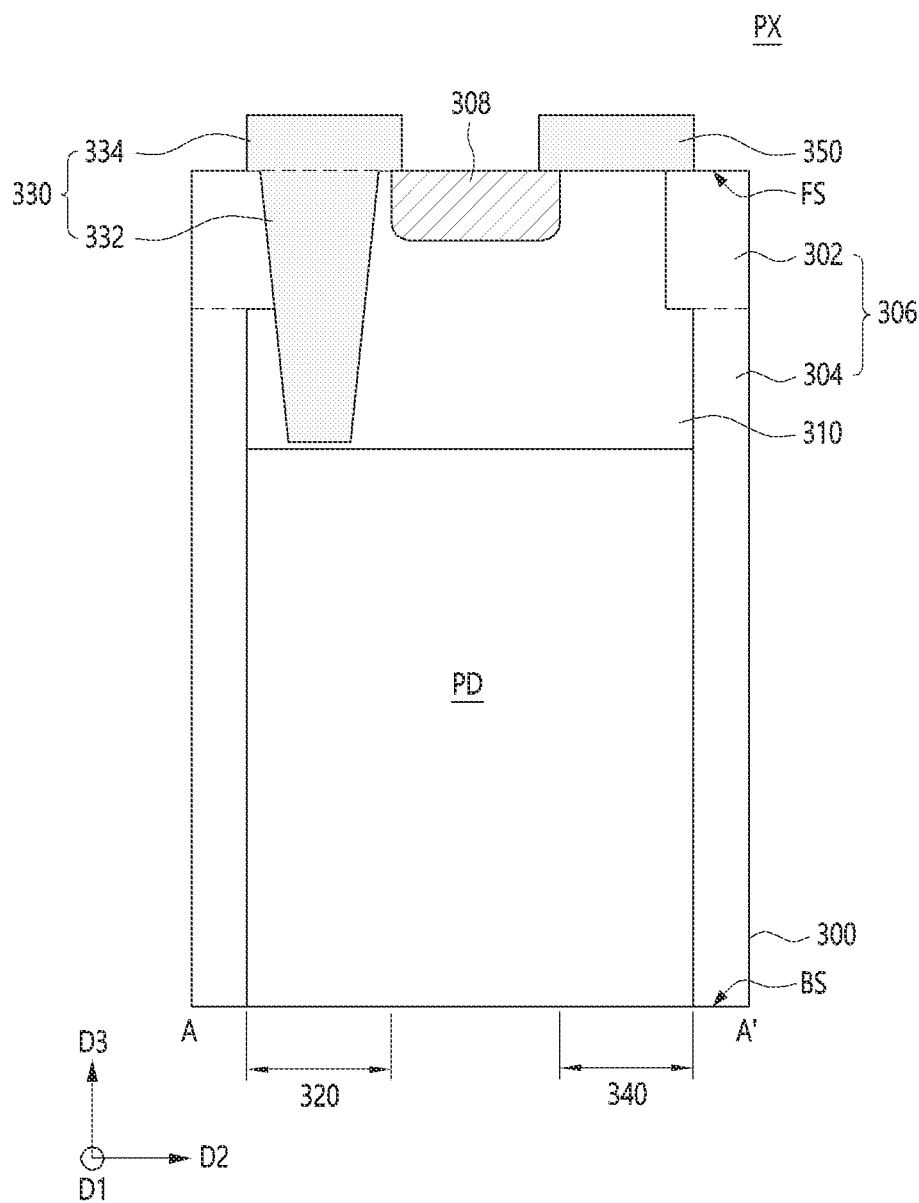
FIG. 5A is a cross-sectional view taken along a line A-A' in FIG. 4.
Figure 6A:
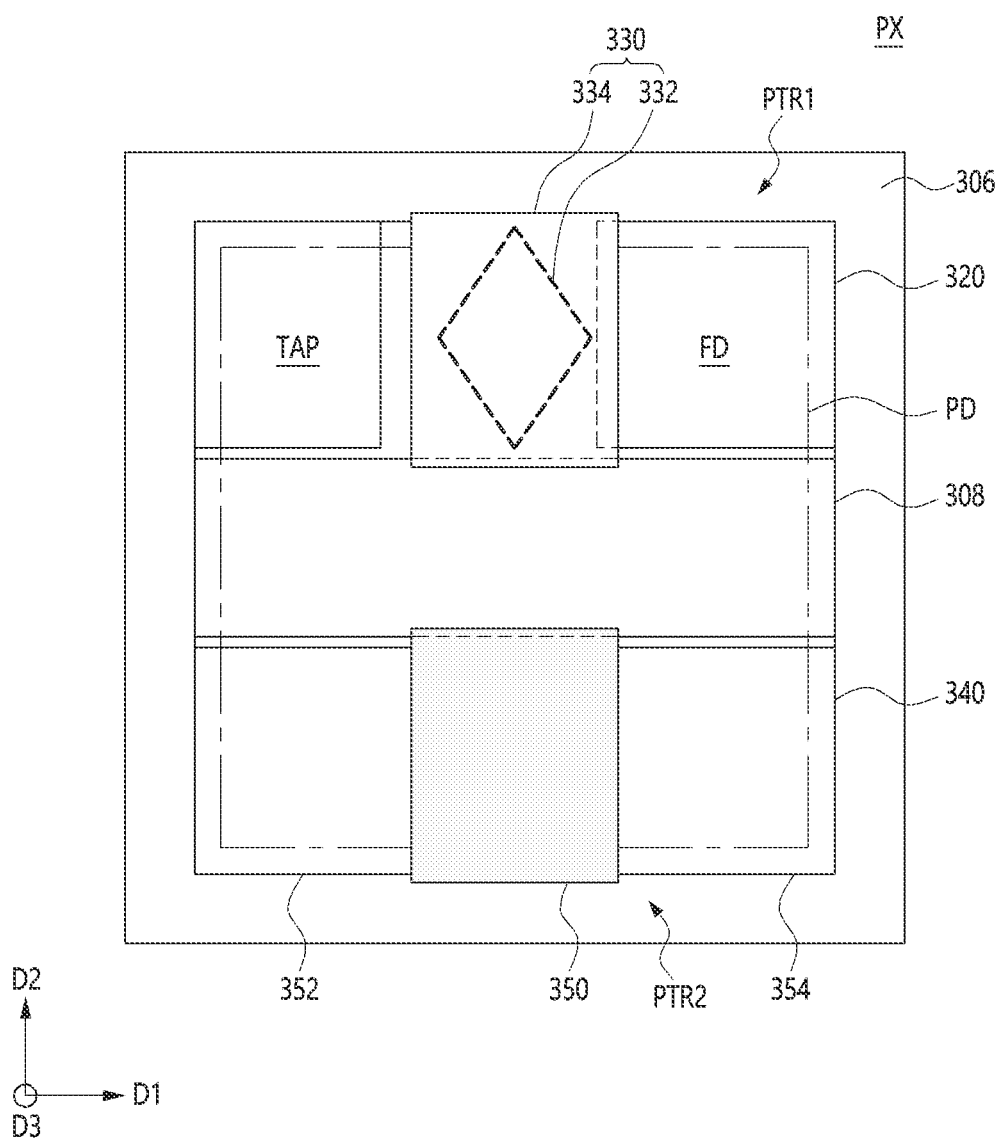
FIGS. 6A and 6B are plan views illustrating a unit pixel PX in FIG. 4.
Figure 6B:
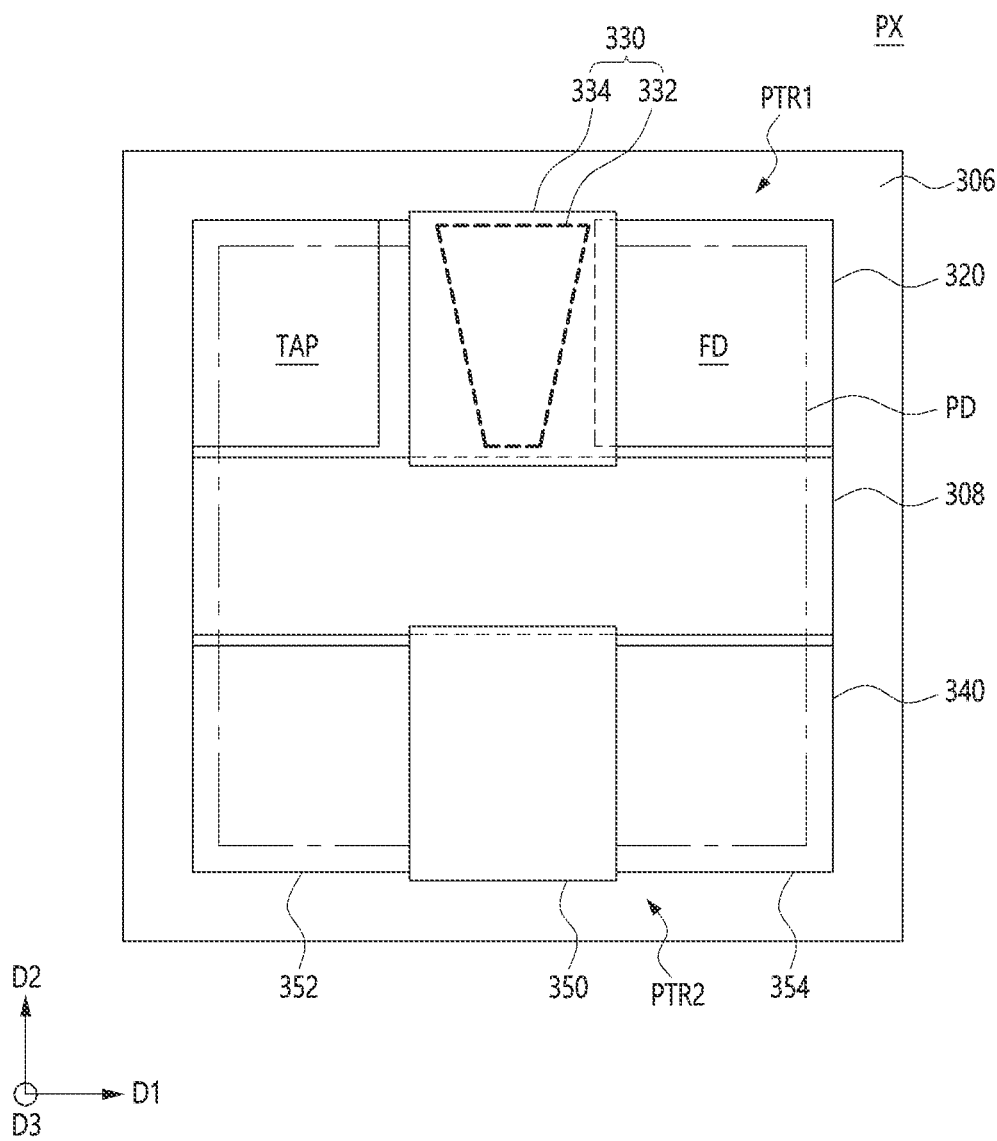

FIG. 4 illustrates an example of a unit pixel of an image sensing device based on some embodiments of the disclosed technology, FIG. 5A is a cross-sectional view taken along a line A-A' in FIG. 4, FIG. 5B a cross-sectional view taken along a line B-B' in FIG. 4, FIG. 5C a cross-sectional view taken along a line C-C' in FIG. 4, FIG. 5D a cross-sectional view taken along a line D-D' in FIG. 4, and FIGS. 6A and 6B are plan views illustrating a unit pixel PX in FIG. 4.

Referring to FIGS. 4, 5A, 5B, 5C, and 5D, a unit pixel PX implemented based on some embodiments of the disclosed technology may include a substrate 300, a first isolation structure 306, a photoelectric conversion element PD, a well region 310 and a second isolation structure 308. The substrate 300 may have a front surface FS and a back surface BS. The first isolation structure 306 may be formed in the substrate 300 to define the pixel region. The photoelectric conversion element PD may be formed at a lower region of the substrate 300. The well region 310 may be formed at an upper region of the substrate 300. The second isolation structure 308 may be formed in the well region 310 to define a first active region 320 and a second active region 340.

The substrate 300 may include a bulk single crystalline silicon wafer, a silicon-on-insulator (SOI) wafer, a compound semiconductor wafer including Si—Ge, a wafer including a silicon epitaxial layer, etc. For example, the substrate 300 may include a bulk single crystalline silicon wafer doped with P type impurities.

Although not depicted in the drawings, a control circuit for controlling the unit pixel PX may be further formed on the front surface FS of the substrate 300. Referring to FIG. 1, the control circuit may include the CDS 120, the ADC 130, the buffer 140, the row driver 150, the timing generator 160, the control register 170 and the ramp signal generator 180. The back surface BS of the substrate 300 may correspond to the surface structured to receive light rays that are incident on the photoelectric conversion element PD. In addition, an optical filter, a grid pattern, a micro-lens, or other structures may be formed on the back surface BS of the substrate 300.

The first isolation structure 306 may be structured to define the pixel region. Further, the first isolation structure 306 may physically, electrically, and/or optically isolate the adjacent unit pixels PX from each other to prevent electrical and/or optical crosstalks. The first isolation structure 306 may be structured to surround the pixel region. The first isolation structure 306 may include a trench type isolation structure. The trench type isolation structure may include a trench formed in the substrate 300, and an insulating layer formed in the trench. The insulating layer in the trench may include a single layer, or multiple layers including stacked insulating layers having different properties. The insulating layer formed in the trench may include an insulating material having a certain refractivity, reducing or minimizing optical crosstalks by preventing the incident light from interfering with adjacent pixels PX. Further, the insulating layer formed in the trench may include a dielectric material having a high dielectric constant with fixed charges to prevent the electrical crosstalk. In some implementations, the trench type isolation structure may include a shallow trench isolation (STI) 302 and a deep trench isolation (DTI) 304. For example, the first isolation structure 306 may include the STI 302 which is in contact with the front surface FS of the substrate 300, and the DTI 304 which is in contact with a back surface of the STI 302 and the back surface BS of the substrate 300. The STI 302 may have a width substantially equal to or greater than a width of the DTI 304.

In an implementation, the first isolation structure 306 may include the STI 302 and the DTI 304. In another implementation, the first isolation structure 306 may include only the DTI 304. In one example, the first isolation structure 306 may be in contact with the front surface FS and the back surface BS of the substrate 300 and penetrate through the substrate 300. In another example, the first isolation structure 306 may be in contact with the front surface FS of the substrate 300. The isolation structure 306 may be spaced apart from the back surface BS of the substrate 300.

The photoelectric conversion element PD in the lower region of the substrate 300 may generate electrical currents corresponding to the incident light. The photoelectric conversion element PD may include a photodiode. The photodiode PD may include N type impurity regions and P type impurity regions that are vertically stacked.

The well region 310 in the upper region of the substrate 300 may provide the first pixel transistor PTR1 and the second pixel transistor PTR2 with a channel, respectively. The well region 310 may have a back surface in contact with an upper surface of the photoelectric conversion element PD. The well region 310 may overlap with the photoelectric conversion element PD. The well region 310 may include an impurity region formed by implanting impurities into the substrate 300. For example, the well region 310 may include a P type impurity region.

The second isolation structure 308 may be formed in the well region 310 to define the first active region 320 and the second active region 340. The first pixel transistor PTR1 may be formed in the first active region 320. The second pixel transistor PTR2 may be formed in the second active region 340. The second isolation structure 308 may extend in the first direction D1. Both ends of the second isolation structure 308 may be in contact with the first isolation structure 306 in the first direction D1. The second isolation structure 308 may include a junction type isolation structure. The junction type isolation structure may include an impurity region having the same conductivity type as the well region 310. In one example, the junction type isolation structure may include a P type impurity region. The junction type isolation structure may have a doping concentration higher than a doping concentration of the well region 310.

In an implementation, the second isolation structure 308 may include the junction type isolation structure. In another implementation, the second isolation structure 308 may include a trench type isolation structure such as a shallow trench isolation (STI).

Further, the unit pixel PX implemented based on some embodiments of the disclosed technology may include the first pixel transistor PTR1 and the tap region TAP formed in the first active region 320. In one example, the unit pixel PX may include the floating diffusion region FD and the tap region TAP formed in the well region 310, and a first gate 330 formed between the floating diffusion region FD and the tap region TAP. The floating diffusion region FD and the tap region TAP may be spaced apart from each other along the first direction D1. The first gate 330 may include a recess gate. Although not shown in FIGS. 5A to 5D, a gate insulating layer of the first gate 330 may be formed between a gate electrode and the substrate 300.

The floating diffusion region FD may overlap with one corner of the photoelectric conversion element PD. The tap region TAP may overlap with another corner of the photoelectric conversion element PD. Each of the floating diffusion region FD and the tap region TAP may include an impurity region formed by implanting impurities into the substrate 300. In one example, the floating diffusion region FD may include an N type impurity region. The tap region TAP may include a P type impurity region. The tap region TAP may have the same conductivity type as the well region 310. The tap region TAP may have a doping concentration higher than a doping concentration of the well region 310.

The first pixel transistor PTR1 may include the transfer transistor Tx in FIG. 3 configured to transfer the photo-generated charge carriers generated in the photoelectric conversion element PD to the floating diffusion region FD in response to a transmission signal as a gate signal. Thus, the first gate 330 may include a transmission gate 330 configured to receive the transmission signal. The floating diffusion region may act as a source of the first pixel transistor PTR1. The photoelectric conversion element PD may act as a drain of the first pixel transistor PTR1.

The transfer gate 330 may include a recess electrode 332 formed in the well region 310. The recess electrode 332 may have a first cross-sectional shape that can minimize the path of photo-generated charge carriers such as electrons moving from the photoelectric conversion element PD to the floating diffusion region FD. The recess electrode 332 may overlap with the photoelectric conversion element PD. The recess electrode 332 may have a bottom surface structured to face an upper surface of the photoelectric conversion element PD in the third direction D3. Thus, the bottom surface of the recess electrode 332 may be spaced apart from the upper surface of the photoelectric conversion element PD in the third direction D3. The transfer gate 330 may include a plate electrode 334. The plate electrode 334 may be formed on the substrate 300. The plate electrode 334 may be electrically connected with the recess electrode 332. The plate electrode 334 may have a second cross-sectional shape that can minimize the path of photo-generated charge carriers such as electrons moving from the photoelectric conversion element PD to the floating diffusion region FD. The second cross-sectional shape may be different from the first cross-sectional shape. The first cross-sectional shape and the second cross-sectional shape may be different from each other to improve the transmission efficiency of the photo-generated electrical charge carriers that move between the photoelectric conversion element PD and the floating diffusion region FD. In an embodiment of the disclosed technology, the first cross-sectional shape may be a triangular shape and the second cross-sectional shape may be a polygonal shape including at least four corners. In one example, when the transfer gate 330 is formed between the tap region TAP and the floating diffusion region FD, the transmission efficiency of the photo-generated charge carriers transferred from the tap region TAP may be dependent on the path of photo-generated charge carriers to the floating diffusion region FD, which may vary depending on a cross-sectional shape of the recess electrode 332. For example, when the cross-sectional shape of the recess electrode 332 is a square shape, the photo-generated charge carriers move from the tap region TAP to the floating diffusion region FD along the sides of the recess electrode 332, which has the square shape. Thus, the photo-generated charge carriers need to travel a long distance, and the side of the recess electrode 332 facing the tap region TAP may act as a barrier against the flow of the photo-generated charge carriers, decreasing the transmission efficiency of the charge carriers. In contrast, in some embodiments of the disclosed technology, sides of the cross-sectional shape of the recess electrode 332 that faces the tap region TAP and the floating diffusion region FD, respectively, are not in parallel with side walls of the tap region TAP and the floating diffusion region FD so that the sides of the recess electrode 332 does not act as a barrier against the flow of the photo-generated charge carriers. In an implementation, the cross-sectional shape of the recess electrode 332 has a triangular shape to reduce the length of the path of the photo-generated charge carriers that flow from the tap region TAP to the floating diffusion region FD. Further, the recess electrode 332 having a triangular shape does not have any side structure that acts as a barrier against the flow of the photo-generated charge carriers, thereby improving the transmission efficiency of the charge carriers and preventing the image lag.

In an implementation, the first cross-sectional shape may be a triangular shape as discussed above. In another implementation, the first cross-sectional shape may be a rhombic shape as shown in FIG. 6A. In another implementation, the first cross-sectional shape may be a trapezoidal shape as shown in FIG. 6B.

In some implementations, the plate electrode 334 of the transfer gate 330 may have a polygonal cross-sectional shape including at least four corners to cover the recess electrode 332. In some implementations, a part of the transfer gate 330 may overlap with a part of the floating diffusion region FD to secure a contact area between the transfer gate 330 and a conductive line for applying the transmission signal to the transfer gate 330 and to improve the charge transfer efficiency.

The unit pixel PX may further include the second pixel transistor PTR2 formed in the second active region 340. In some implementations, the unit pixel PX may include a second gate 350 formed on the substrate 300, and first and second junction regions 352 and 354 formed in the well region 310 at both sides of the second gate 350. The first junction region 352 and the second junction region 354 may act as impurity regions of the second pixel transistor PTR2 such as a source and a drain of the second pixel transistor PTR2, respectively. The first and second junction regions 352 and 354 may include an N type impurity region.

Although not shown in FIGS. 5A to 5D, a gate insulating layer of the second gate 350 may be formed between the gate electrode and the substrate 300. Further, the second gate 350 based on an implementation may include a planar gate. In another implementation, the second gate 350 may include a recess gate, a saddle-fin gate, a pin gate, a buried gate, a vertical gate, or other gate structures.

The second pixel transistor PTR2 may include any one of the reset transistor Rx illustrated in FIG. 3 and configured to initialize the floating diffusion region FD in response to the reset signal, the drive transistor Dx illustrated in FIG. 3 and configured to generate the amplified output signal corresponding to an amount of the photo-generated charge carriers in the floating diffusion region FD, the selection transistor Sx illustrated in FIG. 3 and configured to transfer the output signal to the column line in FIG. 1 in response to the selection signal, and a conversion gain transistor DCGx illustrated in FIG. 3 and configured to change the capacitance of the floating diffusion region FD in response to the conversion gain signal. For example, when the second pixel transistor PTR2 is the drive transistor Dx, the second gate 350 may be connected to the floating diffusion region FD. The first junction region 352 and the second junction region 354 may be connected to a power voltage node VDD and the selection transistor Sx, respectively.

In some embodiments of the disclosed technology, the transfer gate 330 adjacent to the floating diffusion region FD in the image sensing device may include the recess electrode 332 having the first cross-sectional shape such as the polygonal shape including at least three corners to improve the transmission efficiency of the photo-generated charge carriers between the photoelectric conversion element PD and the floating diffusion region FD.

Figure 7:
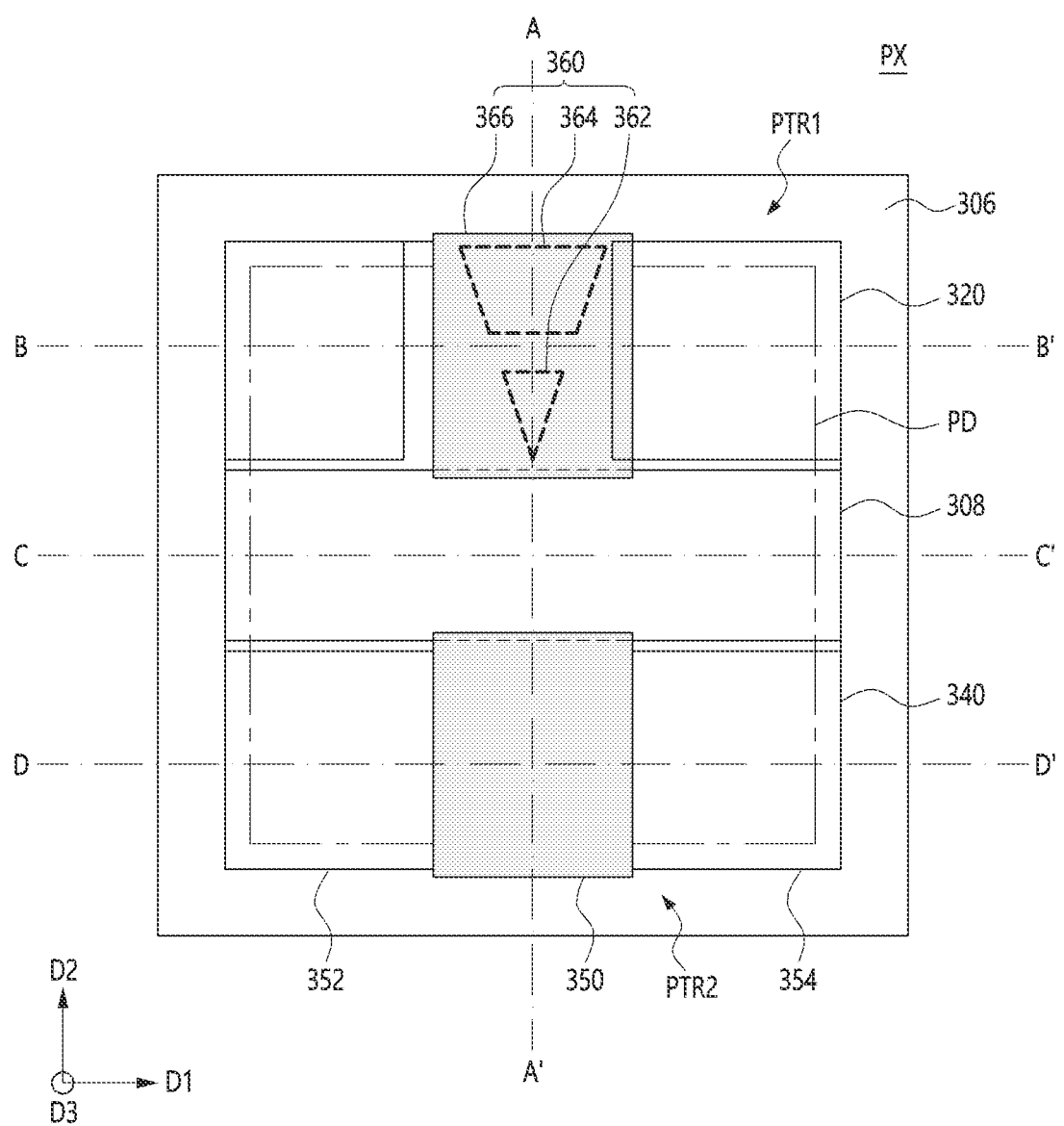
FIG. 7 is a plan view illustrating a unit pixel of an image sensing device based on some embodiments of the disclosed technology.
Figure 8A:
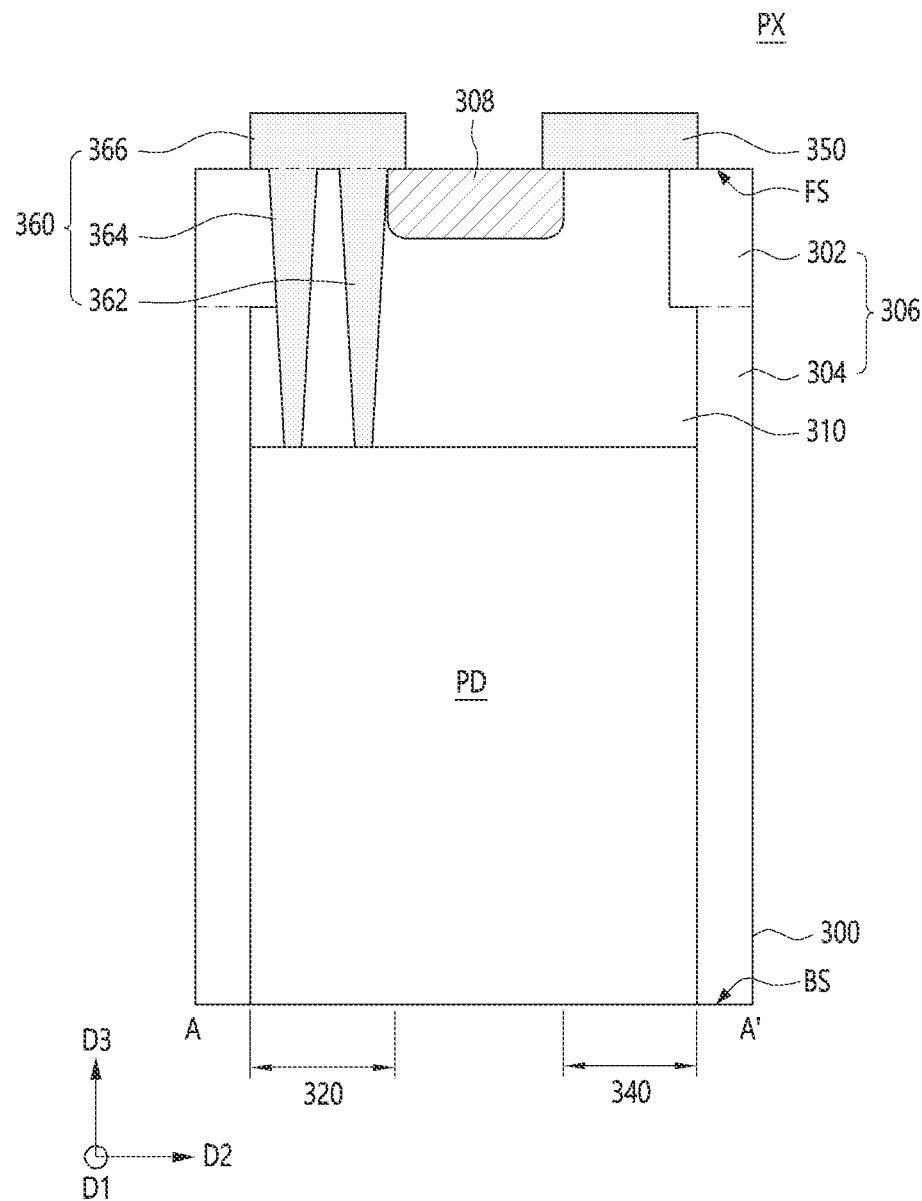
FIG. 8A a cross-sectional view taken along a line A-A' in FIG. 7.
Figure 8B:
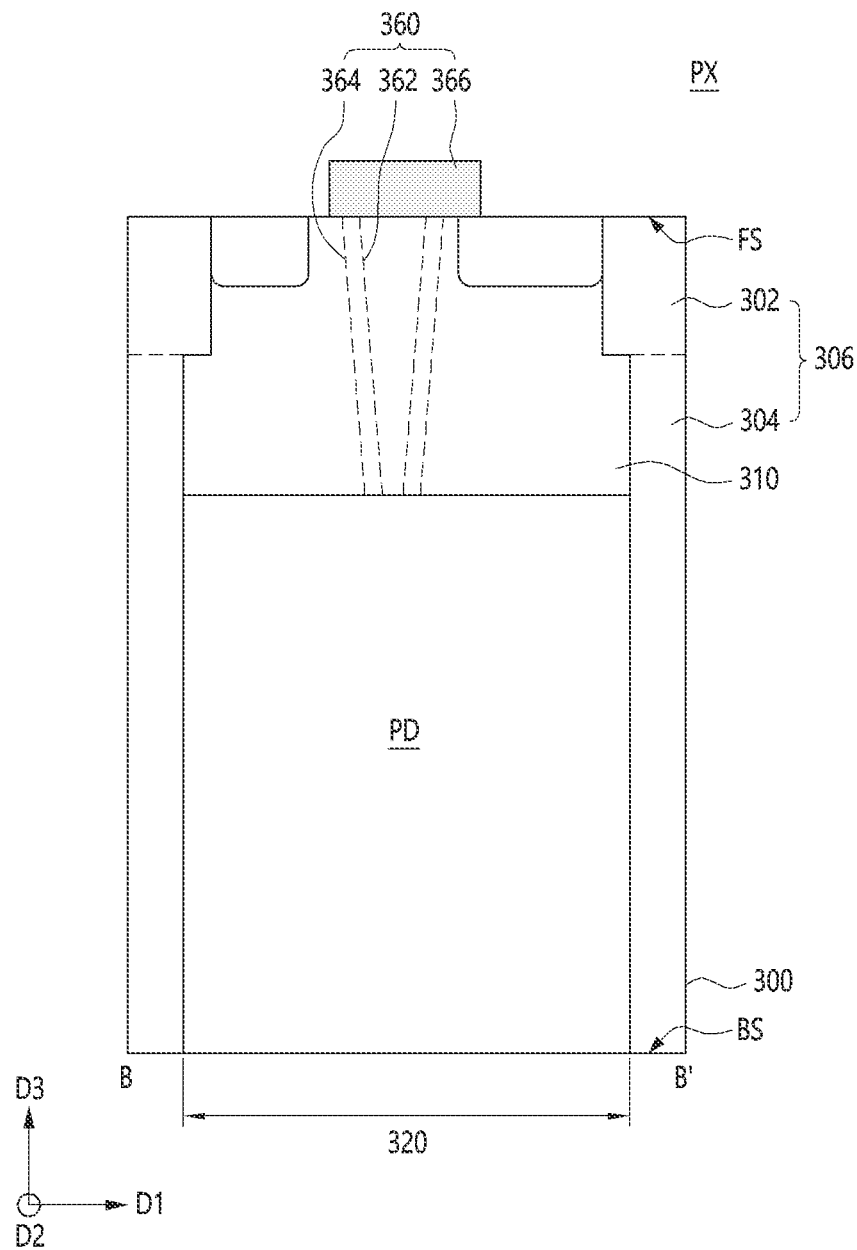
FIG. 8B a cross-sectional view taken along a line B-B' in FIG. 7. IG. 8C a cross-sectional view taken along a line C-C' in FIG. 7.
Figure 8D:
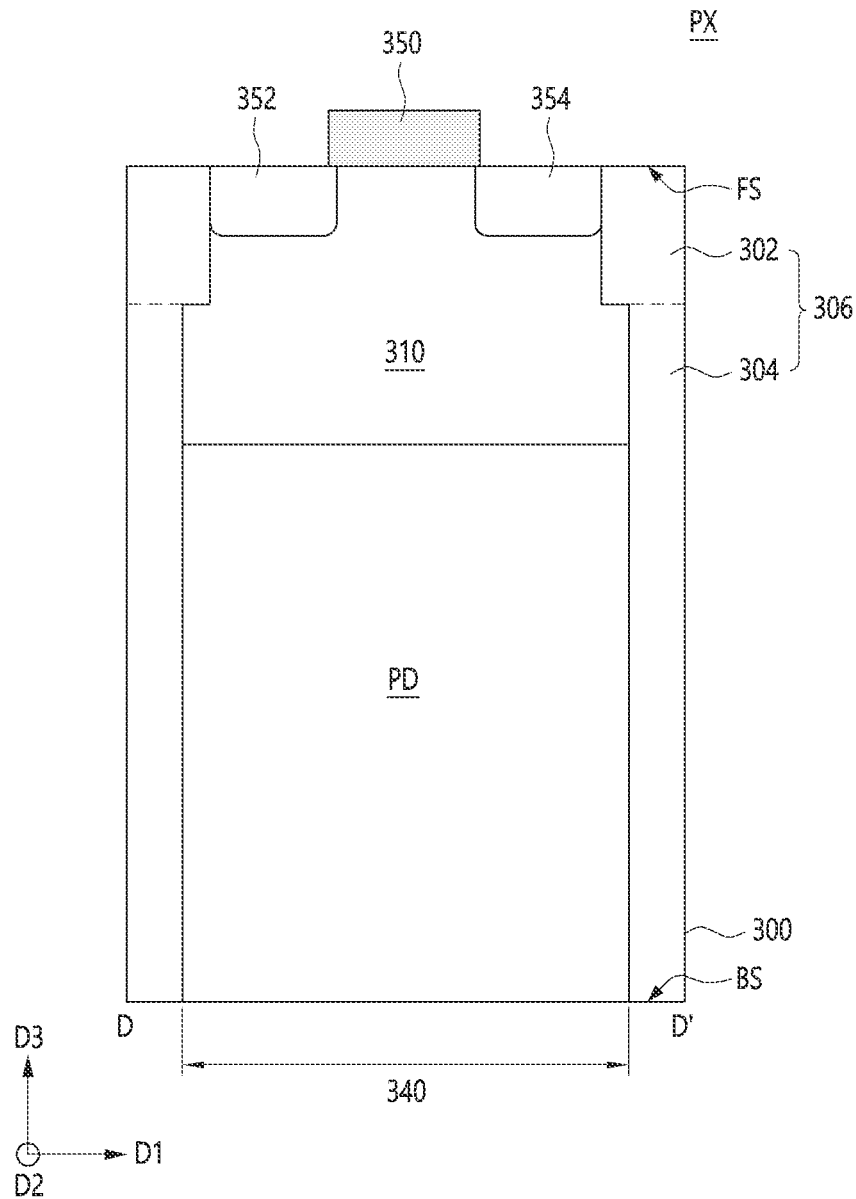
FIG. 8D a cross-sectional view taken along a line D-D' in FIG. 8.
Figure 9A:
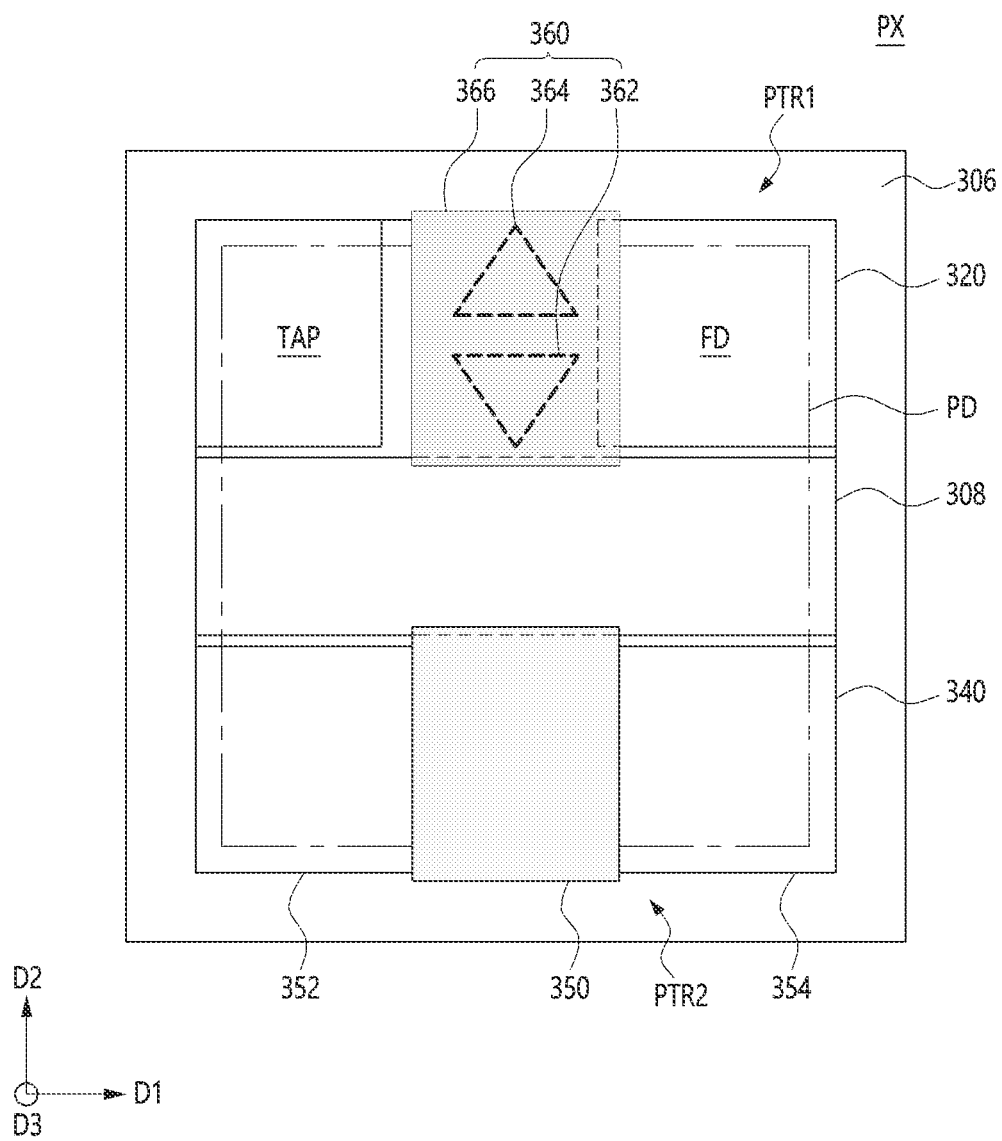
FIGS. 9A and 9B are plan views illustrating a unit pixel PX in FIG. 7.
Figure 9B:
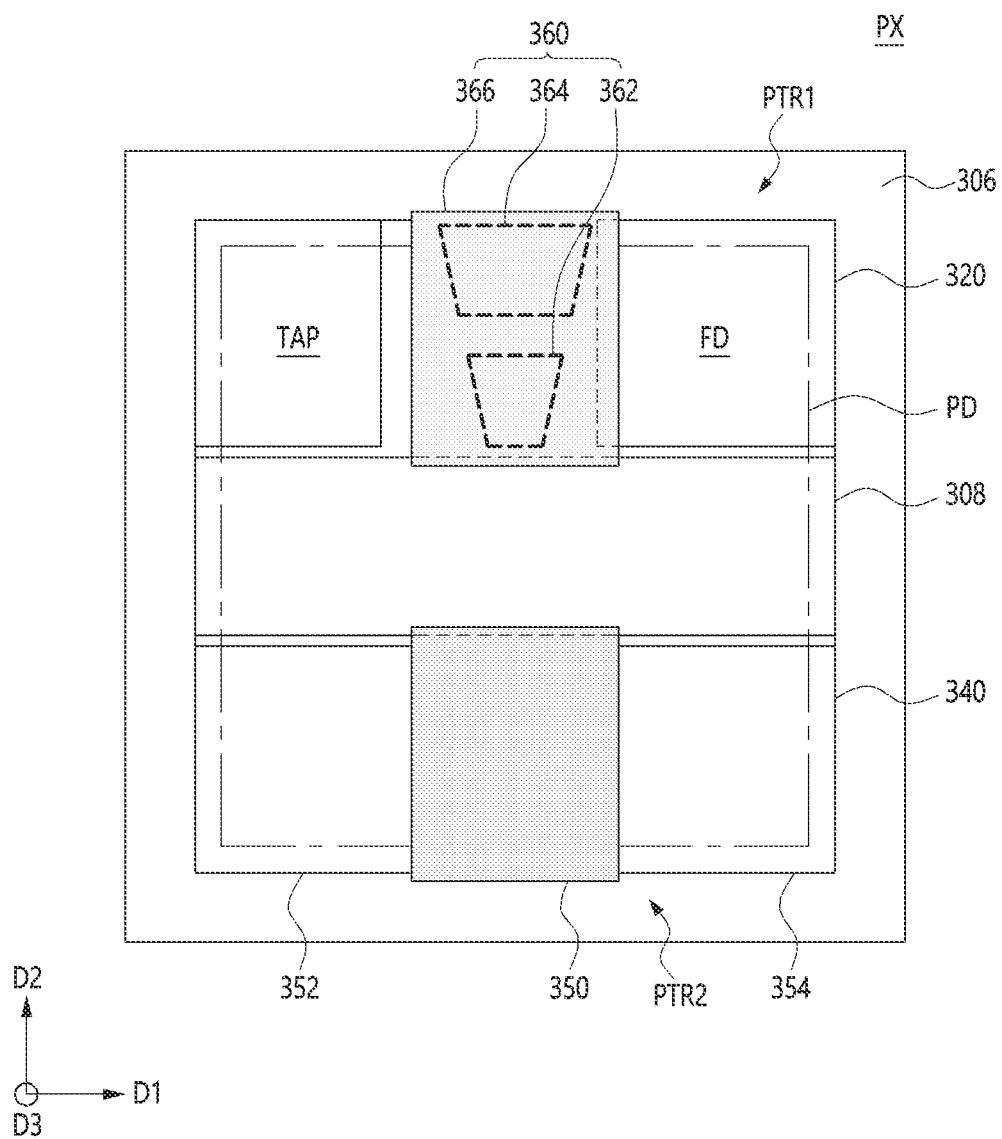

FIG. 7 is a plan view illustrating a unit pixel of an image sensing device based on some embodiments of the disclosed technology, FIG. 8A a cross-sectional view taken along a line A-A' in FIG. 7, FIG. 8B a cross-sectional view taken along a line B-B' in FIG. 7, FIG. 8C a cross-sectional view taken along a line C-C' in FIG. 7, FIG. 8D a cross-sectional view taken along a line D-D' in FIG. 8, and FIGS. 9A and 9B are plan views illustrating a unit pixel PX in FIG. 7. In FIGS. 7 and 8A-8D, elements with the same reference numerals as those discussed above may have the same or similar structures.

Referring to FIGS. 7, 8A, 8B, 8C, and 8D, a unit pixel PX of example embodiments may include a substrate 300, a first isolation structure 306, a photoelectric conversion element PD, a well region 310 and a second isolation structure 308. The substrate 300 may have a front surface FS and a back surface BS. The first isolation structure 306 may be formed in the substrate 300 to define the pixel region. The photoelectric conversion element PD may be formed at a lower region of the substrate 300. The well region 310 may be formed at an upper region of the substrate 300. The second isolation structure 308 may be formed in the well region 310 to define a first active region 320 and a second active region 340.

The unit pixel PX based on some example embodiments of the disclosed technology may include the first pixel transistor PTR1 and the tap region TAP formed in the first active region 320. In one example, the unit pixel PX may include the floating diffusion region FD and the tap region TAP formed in the well region 310, and a first gate 330 formed between the floating diffusion region FD and the tap region TAP. The floating diffusion region FD and the tap region TAP may be spaced apart from each other in the first direction D1. The first gate 330 may include a recess gate. Although not shown in FIGS. 8A to 8D, a gate insulating layer of the first gate 330 may be formed between a gate electrode and the substrate 300.

The first pixel transistor PTR1 may include the transfer transistor configured to transfer the photo-generated charge carriers generated in the photoelectric conversion element PD to the floating diffusion region FD in response to a transmission signal. Thus, the first gate 360 may include a transfer gate 360 configured to receive the transmission signal. The floating diffusion region may act as a source of the first pixel transistor PTR1. The photoelectric conversion element PD may act as a drain of the first pixel transistor PTR1.

The transfer gate 360 may include a first recess electrode 362 and a second recess electrode 364. The first recess electrode 362 formed in the well region 310. The first recess electrode 362 may have a first cross-sectional shape. The second recess electrode 364 may be spaced apart from the first recess electrode 362. The second recess electrode 364 may have a second cross-sectional shape. In order to effectively improve the transmission efficiency of the photo-generated charge carriers moving from the tap region TAP, the first recess electrode 362 and the second recess electrode 364 may be spaced apart from each other in the second direction D2. The first recess electrode 362 and the second recess electrode 364 may overlap with the photoelectric conversion element PD. Each of the first recess electrode 362 and the second recess electrode 364 may have a bottom surface structured to face an upper surface of the photoelectric conversion element PD in the third direction D3. Thus, the bottom surfaces of each of the first and second recess electrodes 362 and 364 may be spaced apart from the upper surface of the photoelectric conversion element PD. The first recess electrode 362 and the second recess electrode 364 are formed in the third direction D3. The transfer gate 360 may include a plate electrode 366. The plate electrode 366 may be formed on the substrate 300 to be electrically connected with the first and second recess electrodes 362 and 364. The plate electrode 366 may have a third cross-sectional shape different from the first and second cross-sectional shapes. The first cross-sectional shape, the second cross-sectional shape and the third cross-sectional shape may be different from each other to improve the transmission efficiency of the photo-generated charge carriers between the photoelectric conversion element PD and the floating diffusion region FD. For example, the first and second cross-sectional shapes may be a polygonal shape including at least four corners. In some implementations, the each of first and second cross-sectional shapes may include any one of a triangular shape, a rhombic shape and a trapezoidal shape. However, the first and second cross-sectional shapes may be different from each other. For example, the first cross-sectional shape may be the triangular shape and the second cross-sectional shape may be the rhombic shape.

In some example embodiments of the disclosed technology, each of the first and second cross-sectional shapes may include any one of a triangular shape, a rhombic shape and a trapezoidal shape and the first and second cross-sectional shapes may be different from each other. In other embodiments of the disclosed technology, as shown in FIG. 9A, each of the first and second cross-sectional shapes may include any one of a triangular shape, a rhombic shape and a trapezoidal shape, and the first cross-sectional shape may be substantially the same as the second cross-sectional shape. The first cross-sectional shape may have an area substantially the same as an area of the second cross-sectional shape. Further, the first cross-sectional shape may be symmetrical to the second cross-sectional shape. Alternatively, as shown in FIG. 9B, each of the first and second cross-sectional shapes may include any one of a triangular 20) shape, a rhombic shape and a trapezoidal shape, and the first cross-sectional shape may be substantially the same as the second cross-sectional shape. The first cross-sectional shape may have an area different from an area of the second cross-sectional shape. Further, unlike the example discussed above, the first cross-sectional shape is not symmetrical to the second cross-sectional shape.

The plate electrode 366 of the transfer gate 360 having the polygonal cross-sectional shape including at least four corners may cover the first and second recess electrodes 362 and 364. In some implementations, a part of the transfer gate 360 may overlap with a part of the floating diffusion region FD to secure a contact area between the transfer gate 360 and a conductive line for applying the transmission signal to the transfer gate 360 and to improve the transmission efficiency of the charge.

The unit pixel PX may further include the second pixel transistor PTR2 formed in the second active region 340. In some implementations, the unit pixel PX may include a second gate 350 formed on the substrate 300, and first and second junction regions 352 and 354 formed in the well region 310 at both sides of the second gate 350. The first junction region 352 and the second junction region 354 may act as impurity regions of the second pixel transistor PTR2 such as a source and a drain of the second pixel transistor PTR2, respectively. The first and second junction regions 352 and 354 may include an N type impurity region. Although not shown in FIGS. 8A to 8D, a gate insulating layer of the second gate 350 may be formed between the gate electrode and the substrate 300.

In some embodiments of the disclosed technology, the transfer gate 360 adjacent to the floating diffusion region FD may include the first recess electrode 362 having the first cross-sectional shape and the second recess electrode 364 having the second cross-sectional shape. The first cross-sectional shape may have any one of the triangular shape, the rhombic shape and the trapezoidal shape and the second cross-sectional shape may have any one of the triangular shape, the rhombic shape and the trapezoidal shape. Thus, the transmission efficiency of the photo-generated charge carriers between the photoelectric conversion element PD and the floating diffusion region FD may be improved.

Further, the first recess electrode 362 may be spaced apart from the second recess electrode 364 to further improve the transmission efficiency of the photo-generated charge carriers between the photoelectric conversion element PD and the floating diffusion region FD.

Only limited examples of implementations or embodiments of the disclosed technology are described or illustrated. Variations and enhancements for the disclosed implementations or embodiments and other implementations or embodiments are possible based on what is disclosed and illustrated in this patent document.

What is claimed is:

1. An image sensing device comprising:
   a substrate including an upper region and a lower region, the substrate including impurities of a first conductivity type;
   a photoelectric conversion element structured to convert light into electrical charges and formed in the lower region of the substrate, the photoelectric conversion element including impurities of a second conductivity type impurity opposite to the first conductivity type;
   a floating diffusion region formed in the upper region of the substrate and coupled to receive the electrical charges from the photoelectric conversion element, the floating diffusion region including impurities of the second conductivity type; and
   a transfer gate formed in the upper region of the substrate adjacent to the floating diffusion region and coupled between the floating diffusion region and the photoelectric conversion element to transfer the electrical charges from the photoelectric conversion element to the floating diffusion region, the transfer gate including a recess electrode structured to have a triangular cross-sectional shape and a triangular planar shape to provide a path for transferring the electrical charges.

2. The image sensing device of claim 1, further comprising a tap region formed in the upper region of the substrate,
   wherein the tap region includes impurities of the first conductivity type, the tap region is formed in the upper region of the substrate, and a doping concentration of the tap region is higher than a doping concentration of the substrate,
   wherein the transfer gate is positioned between the tap region and the floating diffusion region, and
   wherein the floating diffusion region, the transfer gate and the tap region are formed over the photoelectric conversion element.

3. The image sensing device of claim 2, wherein the floating diffusion region is structured to overlap with one corner of the photoelectric conversion element, and the tap region is structured to overlap with another corner of the photoelectric conversion element facing the one corner.

4. The image sensing device of claim 1, wherein the transfer gate further comprises a plate electrode formed on the substrate and electrically connected with the recess electrode, and a part of the plate electrode is structured to overlap with a part of the floating diffusion region.

5. The image sensing device of claim 1, wherein the recess electrode is structured to overlap with the photoelectric conversion element, and the recess electrode has a bottom surface spaced apart from an upper surface of the photoelectric conversion element.

6. An image sensing device comprising:
   a substrate including an upper region and a lower region, the substrate including impurities of a first conductivity type;
   a photoelectric conversion element structured to convert light into electrical charges and formed in the lower region of the substrate, the photoelectric conversion element including impurities of a second conductivity type opposite to the first conductivity type;

a floating diffusion region formed in the upper region of the substrate to receive the electrical charges from the photoelectric conversion element, the floating diffusion region including impurities of the second conductivity type; and a transfer gate formed adjacent to the floating diffusion region to provide a path to the electrical charges moving from the photoelectric conversion element to the floating diffusion region, wherein the transfer gate comprises:

a recess electrode formed in the upper region of the substrate and structured to have a first cross-sectional shape; and a plate electrode formed on the substrate and electrically connected with the recess electrode and structured to have a second cross-sectional shape different from the first cross-sectional shape, wherein a planar shape of the recess electrode includes at least one of a triangular shape and a polygonal shape.

7. The image sensing device of claim 6, further comprising a tap region formed in the upper region of the substrate, wherein the tap region is formed in the upper region of the substrate and includes impurities of the first conductivity type, wherein a doping concentration of the tap region is higher than a doping concentration of the substrate, and wherein the transfer gate is positioned between the tap region and the floating diffusion region.

8. The image sensing device of claim 7, wherein the floating diffusion region is structured to overlap with one corner of the photoelectric conversion element, and the tap region is structured to overlap with another corner of the photoelectric conversion element facing the one corner.

9. The image sensing device of claim 6, wherein the first cross-sectional shape has a polygonal shape including at least three corners.

10. The image sensing device of claim 6, wherein the second cross-sectional shape has a polygonal shape including at least four corners.

11. The image sensing device of claim 6, wherein the plate electrode is structured to cover the recess electrode, and a part of the plate electrode is structured to overlap with a part of the floating diffusion region.

12. The image sensing device of claim 6, wherein the recess electrode is structured to overlap with the photoelectric conversion element, and the recess electrode has a bottom surface spaced apart from an upper surface of the photoelectric conversion element.

13. An image sensing device comprising:

a substrate including an upper region and a lower region;

a photoelectric conversion element structured to convert light into electrical charges and formed in the lower region of the substrate;

a floating diffusion region formed in the upper region of the substrate to receive the electrical charges from the photoelectric conversion element; and a transfer gate coupled between the floating diffusion region and the photoelectric conversion element to transfer the electrical charges from the photoelectric conversion element to the floating diffusion region, wherein the transfer gate comprises:

a first recess electrode formed in the upper region of the substrate and structured to have a first cross-sectional shape;

a second recess electrode spaced apart from the first recess electrode in the upper region of the substrate and structured to have a second cross-sectional shape; and a plate electrode formed on the substrate and electrically connected with the first and second recess electrodes and structured to have a third cross-sectional shape different from the first and second cross-sectional shapes, wherein at least one of a planar shape of the first recess electrode and a planar shape of the second recess electrode includes a triangular shape.

14. The image sensing device of claim 13, further comprising a tap region formed in the upper region of the substrate, wherein a conductivity type of the tap region is identical to a conductivity type of the substrate, and a doping concentration of the tap region is higher than a doping concentration of the substrate, wherein the transfer gate is positioned between the tap region and the floating diffusion region.

15. The image sensing device of claim 14, wherein the tap region, the transfer gate and the floating diffusion region are aligned with each other in a first direction, and the first recess electrode is spaced apart from the second recess electrode in a second direction perpendicular to the first direction.

16. The image sensing device of claim 14, wherein the floating diffusion region is structured to overlap with one corner of the photoelectric conversion element, and the tap region is structured to overlap with another corner of the photoelectric conversion element facing the one corner.

17. The image sensing device of claim 13, wherein each of the first and second cross-sectional shapes have a polygonal shape including at least three corners, and the first cross-sectional shape is the same as the second cross-sectional shape.

18. The image sensing device of claim 13, wherein each of the first and second cross-sectional shapes have a polygonal shape including at least three corners, and the first cross-sectional shape is different from the second cross-sectional shape.

19. The image sensing device of claim 13, wherein each of the first and second cross-sectional shapes is a triangular shape, a rhombic shape, or a trapezoidal shape.

20. The image sensing device of claim 13, wherein the third cross-sectional shape has a polygonal shape including at least four corners.

21. The image sensing device of claim 13, wherein the plate electrode is structured to cover the first and second recess electrodes, and a part of the plate electrode is structured to overlap with a part of the floating diffusion region.

22. The image sensing device of claim 13, wherein the first and second recess electrodes are structured to overlap with the photoelectric conversion element, and the first and second recess electrodes have bottom surfaces spaced apart from an upper surface of the photoelectric conversion element.

23. The image sensing device of claim 13, wherein the planar shape of the first recess electrode is different from the planar shape of the second recess electrode.

* * * * *